(12) United States Patent
Pahl

(10) Patent No.: US 9,556,022 B2
(45) Date of Patent: Jan. 31, 2017

(54) METHOD FOR APPLYING A STRUCTURED COATING TO A COMPONENT

(71) Applicant: EPCOS AG, München (DE)

(72) Inventor: Wolfgang Pahl, München (DE)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 14/970,749

(22) PCT Filed: May 12, 2014

(86) PCT No.: PCT/EP2014/059633
§ 371 (c)(1),
(2) Date: Dec. 16, 2015

(87) PCT Pub. No.: WO2014/202283
PCT Pub. Date: Dec. 24, 2014

(65) Prior Publication Data
US 2016/0297676 A1    Oct. 13, 2016

(30) Foreign Application Priority Data

Jun. 18, 2013    (DE) ........................ 10 2013 106 353

(51) Int. Cl.
*H01L 21/00*    (2006.01)
*B81C 1/00*    (2006.01)
*B81B 7/00*    (2006.01)

(52) U.S. Cl.
CPC ......... *B81C 1/00825* (2013.01); *B81B 7/0058* (2013.01); *B81B 2201/0257* (2013.01); *B81B 2203/0127* (2013.01); *B81B 2207/012* (2013.01); *B81B 2207/115* (2013.01); *B81C 2201/053* (2013.01); *B81C 2203/0785* (2013.01)

(58) Field of Classification Search
CPC ................. B81B 2201/0257; B81B 2203/0127
USPC ........................................... 438/51
See application file for complete search history.

(56) References Cited

U.S. PATENT DOCUMENTS

| | | | | |
|---|---|---|---|---|
| 2,105,010 A | * | 1/1938 | Sawyer | H04R 17/00 310/331 |
| 3,447,217 A | * | 6/1969 | Kumada | H01L 41/0926 123/556 |
| 3,587,322 A | * | 6/1971 | Lobdell et al. | G01L 19/0007 73/756 |
| 3,726,002 A | * | 4/1973 | Greenstein | H01L 21/4857 174/257 |
| 3,735,211 A | * | 5/1973 | Kapnias | H01L 23/055 156/281 |
| 3,980,917 A | * | 9/1976 | Kakizaki | H01J 29/92 174/50.61 |

(Continued)

FOREIGN PATENT DOCUMENTS

| | | |
|---|---|---|
| DE | 102004011148 | 12/2004 |
| DE | 102004058879 A1 | 6/2006 |

(Continued)

*Primary Examiner* — Caleb Henry
(74) *Attorney, Agent, or Firm* — Nixon Peabody LLP

(57) ABSTRACT

For producing a structured coating, or for carefully lifting off a coating over a sensitive region, it is proposed that a release film be applied and structured under the coating in the region which is not to be coated. In a release step, the release film is reduced in the adhesion in the region which is not to be coated and is subsequently lifted off together with the coating applied over it.

20 Claims, 7 Drawing Sheets

(56) References Cited

U.S. PATENT DOCUMENTS

| | | | | | |
|---|---|---|---|---|---|
| 4,127,840 A | * | 11/1978 | House | | G01L 9/0055 257/419 |
| 4,222,277 A | * | 9/1980 | Kurtz | | G01L 15/00 257/419 |
| 4,277,814 A | * | 7/1981 | Giachino | | G01L 9/0073 361/283.1 |
| 4,314,226 A | * | 2/1982 | Oguro | | H01L 29/84 257/419 |
| 4,424,419 A | * | 1/1984 | Chaput | | H04R 19/01 307/400 |
| 4,454,440 A | * | 6/1984 | Cullen | | G01L 9/0025 310/313 B |
| 4,456,796 A | * | 6/1984 | Nakagawa | | H04R 19/016 307/400 |
| 4,504,703 A | * | 3/1985 | Schneiter | | H04R 1/22 181/163 |
| 4,533,795 A | * | 8/1985 | Baumhauer, Jr. | | G01L 9/0073 29/25.35 |
| 4,545,440 A | * | 10/1985 | Treadway | | B21D 31/02 173/132 |
| 4,558,184 A | * | 12/1985 | Busch-Vishniac | | H04R 19/005 29/594 |
| 4,628,740 A | * | 12/1986 | Ueda | | G01L 9/0001 250/231.19 |
| 4,641,054 A | * | 2/1987 | Takahata | | H04R 17/00 310/322 |
| 4,691,363 A | * | 9/1987 | Khanna | | H04R 1/04 381/191 |
| 4,737,742 A | * | 4/1988 | Takoshima | | H03H 9/0557 310/313 R |
| 4,776,019 A | * | 10/1988 | Miyatake | | G01D 5/2417 181/158 |
| 4,816,125 A | * | 3/1989 | Muller | | H04R 17/00 204/192.18 |
| 4,817,168 A | * | 3/1989 | Fidi | | H04R 3/04 181/160 |
| 4,825,335 A | * | 4/1989 | Wilner | | G01P 15/125 29/25.42 |
| 4,866,683 A | * | 9/1989 | Phillips | | B06B 1/0644 29/25.35 |
| 4,908,805 A | * | 3/1990 | Sprenkels | | H04R 19/01 367/170 |
| 4,984,268 A | * | 1/1991 | Brown | | H04M 1/03 379/433.02 |
| 4,985,926 A | * | 1/1991 | Foster | | H04R 17/00 310/366 |
| 5,059,848 A | * | 10/1991 | Mariani | | H03H 9/1092 310/313 R |
| 5,091,051 A | * | 2/1992 | Greer | | H03H 3/10 216/65 |
| 5,101,543 A | * | 4/1992 | Cote | | H01G 7/023 29/25.41 |
| 5,146,435 A | * | 9/1992 | Bernstein | | G01H 11/06 29/25.42 |
| 5,151,763 A | * | 9/1992 | Marek | | G01H 11/06 257/415 |
| 5,153,379 A | * | 10/1992 | Guzuk | | H01L 23/552 174/350 |
| 5,178,015 A | * | 1/1993 | Loeppert | | G01L 9/0042 29/25.41 |
| 5,184,107 A | * | 2/1993 | Maurer | | G01L 19/0084 29/621.1 |
| 5,216,490 A | * | 6/1993 | Greiff | | B81B 3/0086 257/415 |
| 5,257,547 A | * | 11/1993 | Boyer | | G01L 19/0038 338/4 |
| 5,357,807 A | * | 10/1994 | Guckel | | G01L 9/0042 338/4 |
| 5,394,011 A | * | 2/1995 | Yamamoto | | H01L 23/10 257/693 |
| 5,408,731 A | * | 4/1995 | Berggvist | | G01L 9/0073 29/25.41 |
| 5,449,909 A | * | 9/1995 | Kaiser | | G01P 15/0894 250/336.1 |
| 5,452,268 A | * | 9/1995 | Bernstein | | H04R 19/005 367/181 |
| 5,459,368 A | * | 10/1995 | Onishi | | H03H 9/0542 310/313 R |
| 5,465,008 A | * | 11/1995 | Goetz | | H01L 21/67121 257/691 |
| 5,477,008 A | * | 12/1995 | Pasqualoni | | H01L 23/04 174/539 |
| 5,490,220 A | * | 2/1996 | Loeppert | | B81B 3/0072 381/113 |
| 5,506,919 A | * | 4/1996 | Roberts | | G02B 26/02 385/1 |
| 5,531,787 A | * | 7/1996 | Lesinski | | H04R 25/606 381/312 |
| 5,545,912 A | * | 8/1996 | Ristic | | G01P 1/023 257/417 |
| 5,573,435 A | * | 11/1996 | Grabbe | | H01R 12/714 439/66 |
| 5,592,391 A | * | 1/1997 | Muyshondt | | H05K 1/0218 174/258 |
| 5,593,926 A | * | 1/1997 | Fujihira | | H01L 21/67023 148/DIG. 28 |
| 5,650,685 A | * | 7/1997 | Kosinski | | H01L 25/16 257/E25.029 |
| 5,659,195 A | * | 8/1997 | Kaiser | | G01P 15/0802 257/369 |
| 5,677,049 A | * | 10/1997 | Torii | | B41M 5/36 428/155 |
| 5,712,523 A | * | 1/1998 | Nakashima | | H03H 3/10 310/313 R |
| 5,739,585 A | * | 4/1998 | Akram | | H01L 23/13 257/680 |
| 5,740,261 A | * | 4/1998 | Loeppert | | H04R 17/02 381/189 |
| 5,821,665 A | * | 10/1998 | Onishi | | H03H 9/059 310/313 R |
| 5,831,262 A | * | 11/1998 | Greywall | | G01D 5/268 250/227.14 |
| 5,838,551 A | * | 11/1998 | Chan | | H01L 23/552 174/372 |
| 5,852,320 A | * | 12/1998 | Ichihashi | | G01L 19/0038 257/417 |
| 5,870,482 A | * | 2/1999 | Loeppert | | B81B 3/0072 381/174 |
| 5,872,397 A | * | 2/1999 | Diffenderfer | | H01L 23/13 257/684 |
| 5,886,876 A | * | 3/1999 | Yamaguchi | | H01L 23/055 174/255 |
| 5,889,872 A | * | 3/1999 | Sooriakumar | | H04R 19/016 381/174 |
| 5,901,046 A | * | 5/1999 | Ohta | | H01L 24/97 174/250 |
| 5,923,995 A | * | 7/1999 | Kao | | B81C 1/00888 438/460 |
| 5,939,968 A | * | 8/1999 | Nguyen | | H01C 1/1406 337/12 |
| 5,990,418 A | * | 11/1999 | Bivona | | H01L 23/16 174/546 |
| 5,999,821 A | * | 12/1999 | Kaschke | | H04M 1/0202 379/429 |
| 6,004,419 A | * | 12/1999 | Torii | | B41M 3/16 156/234 |
| 6,012,335 A | * | 1/2000 | Bashir | | B81C 1/00158 257/E21.026 |
| 6,052,464 A | * | 4/2000 | Harris | | G01N 33/573 379/433.07 |
| 6,057,222 A | * | 5/2000 | Pahl | | H01L 23/3171 228/180.21 |
| 6,075,867 A | * | 6/2000 | Bay | | H04R 19/00 181/171 |
| 6,078,245 A | * | 6/2000 | Fritz | | H01H 85/046 337/160 |
| 6,108,184 A | * | 8/2000 | Minervini | | H01C 7/027 338/21 |

(56) References Cited

U.S. PATENT DOCUMENTS

| | | | | |
|---|---|---|---|---|
| 6,118,881 A * | 9/2000 | Quinlan | H04M 1/19 | 379/433.03 |
| 6,136,175 A * | 10/2000 | Stelzl | H03H 9/02929 | 205/220 |
| 6,136,419 A * | 10/2000 | Fasano | B32B 18/00 | 174/250 |
| 6,150,753 A * | 11/2000 | DeCastro | G10K 11/02 | 310/325 |
| 6,157,546 A * | 12/2000 | Petty | H05K 9/0035 | 174/379 |
| 6,163,071 A * | 12/2000 | Yamamura | H01L 23/49838 | 257/691 |
| 6,178,249 B1 * | 1/2001 | Hietanen | H04R 19/005 | 367/181 |
| 6,182,342 B1 * | 2/2001 | Sawin | H03H 3/08 | 29/25.35 |
| 6,187,249 B1 * | 2/2001 | Lewellin | B27N 3/02 | 264/109 |
| 6,191,928 B1 * | 2/2001 | Rector | H01C 7/006 | 361/111 |
| 6,236,145 B1 * | 5/2001 | Biernacki | H03H 9/0523 | 310/346 |
| 6,242,842 B1 * | 6/2001 | Pahl | H03H 9/02913 | 310/313 R |
| 6,282,072 B1 * | 8/2001 | Minervini | H01C 13/02 | 361/103 |
| 6,310,420 B1 * | 10/2001 | Pahl | H03H 9/1092 | 310/313 R |
| 6,324,907 B1 * | 12/2001 | Halteren | H04R 19/005 | 310/334 |
| 6,398,943 B1 * | 6/2002 | Arens-Fischer | C25F 3/12 | 205/666 |
| 6,400,065 B1 * | 6/2002 | Toda | B06B 1/0655 | 310/334 |
| 6,433,412 B2 * | 8/2002 | Ando | | 257/676 |
| 6,437,449 B1 * | 8/2002 | Foster | H01L 23/49575 | 257/676 |
| 6,439,869 B1 * | 8/2002 | Seng | B29C 45/02 | 264/272.17 |
| 6,492,194 B1 * | 12/2002 | Bureau | H01L 21/56 | 257/E21.502 |
| 6,519,822 B1 * | 2/2003 | Stelzl | H03H 9/1078 | 216/17 |
| 6,522,762 B1 * | 2/2003 | Mullenborn | H04R 19/005 | 367/181 |
| 6,528,924 B1 * | 3/2003 | Stelzl | H03H 9/0585 | 310/313 R |
| 6,530,515 B1 * | 3/2003 | Glenn | B81B 7/0077 | 228/180.22 |
| 6,555,758 B1 * | 4/2003 | Stelzl | H01L 21/4853 | 174/260 |
| 6,566,672 B1 * | 5/2003 | Schlough | B65H 7/14 | 250/221 |
| 6,594,369 B1 * | 7/2003 | Une | H04R 19/016 | 381/174 |
| 6,614,911 B1 * | 9/2003 | Watson | B60R 1/12 | 381/111 |
| 6,621,392 B1 * | 9/2003 | Volant | B81B 3/001 | 335/78 |
| 6,625,031 B2 * | 9/2003 | Sano | H05K 1/141 | 361/728 |
| 6,649,446 B1 * | 11/2003 | Goetz | H01L 21/563 | 257/E21.503 |
| 6,674,159 B1 * | 1/2004 | Peterson | B81B 7/0067 | 257/431 |
| 6,685,168 B1 * | 2/2004 | Stelzl | H03H 9/058 | 257/778 |
| 6,710,840 B2 * | 3/2004 | Umemoto | G02F 1/133305 | 349/122 |
| 6,722,030 B1 * | 4/2004 | Stelzl | H01L 23/552 | 174/541 |
| 6,732,588 B1 * | 5/2004 | Mullenborn | G01L 9/0073 | 361/761 |
| 6,800,987 B2 * | 10/2004 | Toda | G10K 9/22 | 310/334 |
| 6,809,413 B1 * | 10/2004 | Peterson | B81B 7/0067 | 257/680 |
| 6,829,131 B1 * | 12/2004 | Loeb | H04R 19/005 | 361/115 |
| 6,838,972 B1 * | 1/2005 | Minervini | H01C 1/1406 | 338/22 R |
| 6,871,388 B2 * | 3/2005 | Ishino | H03H 9/0514 | 29/25.35 |
| 6,904,155 B2 * | 6/2005 | Yonehara | H04R 19/01 | 381/174 |
| 6,924,429 B2 * | 8/2005 | Kasai | B32B 18/00 | 174/565 |
| 6,930,364 B2 * | 8/2005 | Bruner | B81C 1/00246 | 257/414 |
| 7,003,127 B1 * | 2/2006 | Sjursen | H04R 19/016 | 381/322 |
| 7,072,482 B2 * | 7/2006 | Van Doorn | H04R 1/08 | 381/322 |
| 7,092,539 B2 * | 8/2006 | Sheplak | G01H 11/08 | 257/528 |
| 7,145,283 B2 * | 12/2006 | Takeuchi | H01L 41/053 | 310/348 |
| 7,298,856 B2 * | 11/2007 | Tajima | H04R 19/005 | 381/111 |
| 7,373,835 B2 * | 5/2008 | Matsubara | B81B 7/0006 | 73/754 |
| 7,439,616 B2 | 10/2008 | Minervini | | |
| 7,476,567 B2 * | 1/2009 | Sato | B81B 7/007 | 438/110 |
| 7,492,019 B2 * | 2/2009 | Carley | B81C 1/00333 | 257/415 |
| 7,537,964 B2 | 5/2009 | Minervini | | |
| 7,692,288 B2 * | 4/2010 | Zhe | B81C 1/0023 | 174/250 |
| 7,903,831 B2 * | 3/2011 | Song | B81C 1/0023 | 381/174 |
| 8,228,898 B2 * | 7/2012 | Everard | H04L 65/1083 | 370/352 |
| 8,432,007 B2 * | 4/2013 | Leidl | B81B 7/0064 | 257/416 |
| 8,829,667 B2 * | 9/2014 | Park | H01L 23/552 | 257/659 |
| 8,857,258 B2 * | 10/2014 | Ohkoshi | G01P 15/02 | 73/504.12 |
| 9,101,044 B2 * | 8/2015 | Shimamura | H01L 23/3121 | |
| 9,363,610 B2 * | 6/2016 | Traynor | B81B 3/0094 | |
| 2001/0008300 A1 | 7/2001 | Yoshihara | | |
| 2002/0067663 A1 * | 6/2002 | Loeppert | B81B 3/0072 | 367/181 |
| 2002/0074239 A1 * | 6/2002 | Berger | C25F 3/12 | 205/667 |
| 2002/0076848 A1 | 6/2002 | Spooner | | |
| 2002/0076910 A1 * | 6/2002 | Pace | B81B 7/0077 | 438/613 |
| 2002/0084722 A1 * | 7/2002 | Vaughn | H05K 3/325 | 310/348 |
| 2002/0102004 A1 * | 8/2002 | Minervini | B81B 7/0064 | 381/175 |
| 2002/0110256 A1 * | 8/2002 | Watson | B60R 1/12 | 381/389 |
| 2002/0194919 A1 * | 12/2002 | Lee | G01L 9/0073 | 73/718 |
| 2003/0007651 A1 * | 1/2003 | Nakashima | H04R 17/00 | 381/114 |
| 2003/0010530 A1 * | 1/2003 | Scheel | H05K 1/03 | 174/260 |
| 2003/0034536 A1 * | 2/2003 | Scheeper | H04R 19/04 | 257/419 |
| 2003/0035558 A1 * | 2/2003 | Kawamura | H04R 19/005 | 381/113 |
| 2003/0047806 A1 * | 3/2003 | Stelzl | C23C 28/021 | 257/730 |

(56) References Cited

U.S. PATENT DOCUMENTS

| | | | |
|---|---|---|---|
| 2003/0124829 A1* | 7/2003 | Pace | B81C 1/00333 438/612 |
| 2003/0133588 A1* | 7/2003 | Pedersen | B81B 3/0072 381/423 |
| 2003/0151133 A1* | 8/2003 | Kinayman | H01L 23/055 257/713 |
| 2003/0153116 A1* | 8/2003 | Carley | B81B 7/0077 438/53 |
| 2003/0189242 A1* | 10/2003 | Ma | B81B 7/0006 257/678 |
| 2004/0032705 A1* | 2/2004 | Ma | H01H 59/0009 361/233 |
| 2004/0046245 A1* | 3/2004 | Minervini | B81B 7/0064 257/704 |
| 2004/0058473 A1* | 3/2004 | Feiertag | H01L 23/49816 438/108 |
| 2004/0064941 A1* | 4/2004 | Dozier, II | B23K 3/087 29/837 |
| 2004/0118595 A1* | 6/2004 | Flammer | H05K 1/0278 174/254 |
| 2004/0150939 A1* | 8/2004 | Huff | H01G 5/014 361/277 |
| 2004/0157367 A1* | 8/2004 | Wong | H01L 21/50 438/106 |
| 2004/0161530 A1* | 8/2004 | Stark | B81B 7/0067 427/58 |
| 2004/0231872 A1* | 11/2004 | Arnold | H01L 23/04 174/377 |
| 2004/0237299 A1* | 12/2004 | Stelzl | H01L 21/50 29/855 |
| 2004/0239449 A1* | 12/2004 | Stelzl | H03H 9/059 333/187 |
| 2005/0018864 A1* | 1/2005 | Minervini | B81B 7/0061 381/175 |
| 2005/0034888 A1* | 2/2005 | Hoffmann | H01L 24/31 174/558 |
| 2005/0040734 A1* | 2/2005 | Kinoshita | G01C 19/56 310/348 |
| 2005/0069164 A1* | 3/2005 | Muthuswamy | H04R 19/04 381/369 |
| 2005/0093087 A1* | 5/2005 | Kadel | F16K 99/0001 257/415 |
| 2005/0121785 A1* | 6/2005 | Stelzl | H01L 21/561 257/738 |
| 2005/0124181 A1* | 6/2005 | Brown | H01L 24/72 439/66 |
| 2005/0218488 A1* | 10/2005 | Matsuo | B81C 1/00095 257/678 |
| 2005/0242420 A1* | 11/2005 | Matsuda | H03H 9/0071 257/684 |
| 2005/0249041 A1* | 11/2005 | Pedersen | H04R 31/006 367/179 |
| 2005/0270135 A1* | 12/2005 | Chua | H01F 17/02 336/192 |
| 2006/0082260 A1* | 4/2006 | Kinoshita | G01C 19/56 310/348 |
| 2006/0115102 A1* | 6/2006 | Mullenborn | H04R 19/005 381/174 |
| 2006/0125577 A1* | 6/2006 | Hsieh | H03H 3/02 333/191 |
| 2006/0137456 A1* | 6/2006 | Dasgupta | G01H 9/00 73/705 |
| 2006/0151203 A1* | 7/2006 | Krueger | H03H 9/0557 174/260 |
| 2006/0157841 A1* | 7/2006 | Minervini | H04R 19/04 257/680 |
| 2006/0213275 A1* | 9/2006 | Cobianu | G01L 1/18 73/754 |
| 2007/0069354 A1* | 3/2007 | Dangelmaier | B81B 7/0058 257/678 |
| 2007/0099327 A1* | 5/2007 | Hartzell | B81C 1/0023 438/51 |
| 2007/0127982 A1* | 6/2007 | Bohlen | B62D 1/187 403/119 |
| 2007/0189558 A1* | 8/2007 | Ogura | B81B 7/0061 381/191 |
| 2007/0217635 A1* | 9/2007 | Ogura | H04R 19/016 381/191 |
| 2007/0222056 A1* | 9/2007 | Bauer | B81C 1/0023 257/687 |
| 2008/0014720 A1* | 1/2008 | Tyler | H01L 21/67092 438/462 |
| 2008/0038577 A1* | 2/2008 | Kruger | H01L 23/3121 428/598 |
| 2008/0048317 A1* | 2/2008 | Krueger | H01L 23/49838 257/737 |
| 2008/0081398 A1* | 4/2008 | Lee | B81C 1/00301 438/109 |
| 2008/0247585 A1* | 10/2008 | Leidl | B81B 7/0061 381/360 |
| 2008/0279407 A1* | 11/2008 | Pahl | B81B 7/0064 381/355 |
| 2008/0315333 A1* | 12/2008 | Combi | B81B 7/0061 257/415 |
| 2009/0001553 A1* | 1/2009 | Pahl | B81B 7/0064 257/704 |
| 2009/0071710 A1* | 3/2009 | Stelzl | H01L 23/3164 174/520 |
| 2009/0081828 A1* | 3/2009 | Freidhoff | B81C 1/00888 438/113 |
| 2009/0104415 A1* | 4/2009 | Schmajew | B41M 5/24 428/195.1 |
| 2009/0127697 A1* | 5/2009 | Pahl | B81B 7/0054 257/698 |
| 2009/0232336 A1* | 9/2009 | Pahl | H04R 1/04 381/175 |
| 2011/0017390 A1 | 1/2011 | Blake | |
| 2013/0203265 A1* | 8/2013 | Hsiao | H01L 21/6835 438/759 |
| 2013/0337608 A1* | 12/2013 | Kotani | H01L 21/561 438/110 |
| 2014/0004658 A1* | 1/2014 | Priewasser | H01L 21/56 438/118 |

FOREIGN PATENT DOCUMENTS

| | | |
|---|---|---|
| DE | 102005053765 A1 | 5/2007 |
| DE | 102008005686 A1 | 7/2009 |
| DE | 102008041059 A1 | 2/2010 |
| JP | 2007-000958 A | 1/2007 |
| WO | WO 2009/150610 | 12/2009 |

* cited by examiner

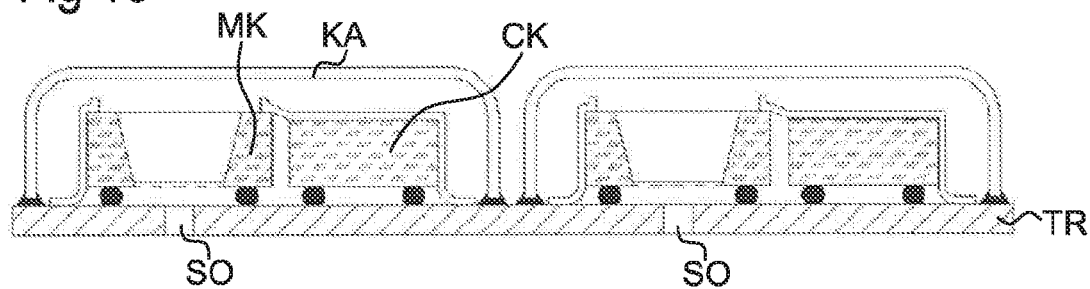
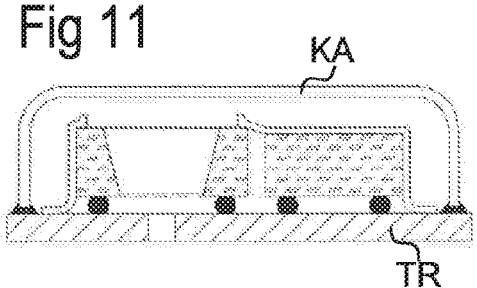
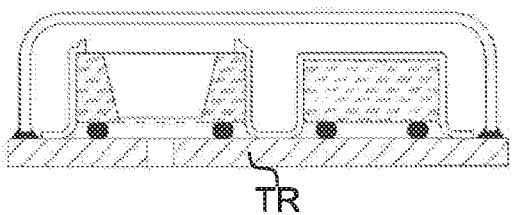
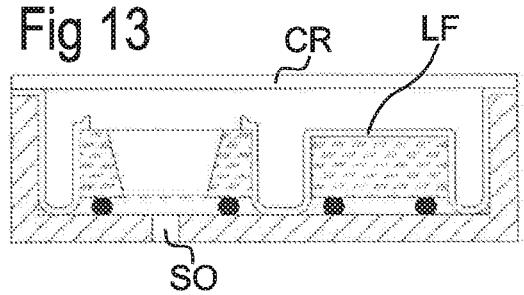
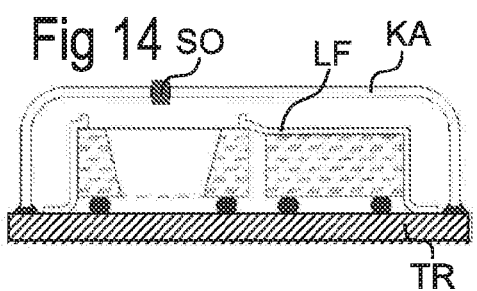
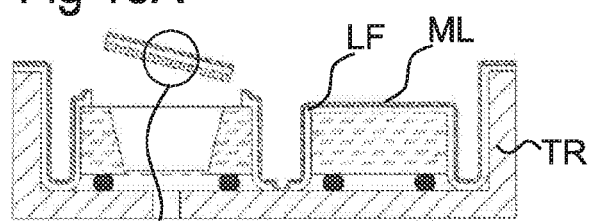
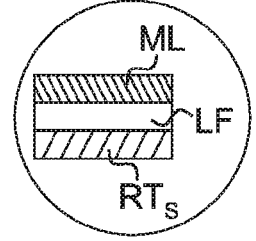
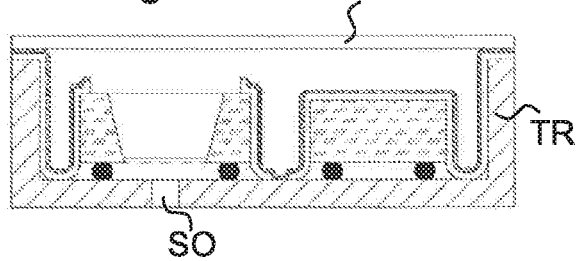

METHOD FOR APPLYING A STRUCTURED COATING TO A COMPONENT

CROSS-REFERENCE TO RELATED APPLICATIONS

This application is a U.S. National Stage of International Application No. PCT/EP2014/059633, filed May 12, 2014, which claims the benefit of German Patent Application No. 10 2013 106 353.5, filed on Jun. 18, 2013, each of which are hereby incorporated herein by reference in their entirety.

The application relates to a method for applying a structured coating to a surface, for example, of an electrical structural element, and in particular a method for encapsulating an assembly which comprises a MEMS component.

MEMS components are mechanically sensitive electromechanical structural elements, the micromechanical structures or movable parts of which are mechanically sensitive and which additionally generally require a free volume in the region of the micromechanical structures for disturbance-free function. MEMS components can be designed as actuators, sensors, positioning elements, or also as microphones. MEMS microphones have a microstructured membrane and require a closed volume in front of and/or behind the membrane, which can be used as the acoustic back volume.

MEMS components designed as microphones, which are applied together with at least one chip component, in particular an ASIC, onto a carrier, and form an assembly or a module therewith, are known. An encapsulation is applied over this, which can comprise a cap or an applied film cover, for mechanical protection and to provide a closed volume. A sound opening can be led through the carrier in this case. In this case, measures are provided to seal off the MEMS components from the carrier, on the one hand, and to provide a closed back volume above the MEMS component in the encapsulation, on the other hand. It is also possible to seal off the upper side, which faces away from the carrier, of the MEMS component above the membrane. In a known method for producing such an encapsulation, a film which can be deep drawn is applied above the assembly and sealed off from the carrier. The sound opening can then be created through the encapsulation above the membrane, or can be led as a borehole from below through the carrier below the membrane.

In all cases, however, the problem exists of carrying out the encapsulation of the MEMS component or an assembly containing a MEMS component so that the movable parts of the MEMS component are not damaged or soiled during the encapsulation method and reliable operation of the MEMS component remains ensured.

This object is achieved according to the invention by a method according to claim 1. Advantageous embodiments of the invention can be inferred from the dependent claims.

Using the proposed method, a structured coating can be applied to the surface of a structural element. The surface has a coating region and a region which is not to be coated, wherein the method as a result creates a coating exclusively in the coating region.

To define the coating region, in a step a), firstly a release film is applied to the structural element and is at least partially fixed inside the region which is not to be coated. In a step b), the release film is removed in the coating region. As a result, a more or less negative structure, which consists of the release film, of the later structured coating is created.

A coating is now applied over the entire area over this negative structure and the surface of the structural element in a step c).

To define the coating region, the coating is severed circumferentially around the region which is not to be coated in a step d) along a first partition line.

For better detachment of the coating in the region which is not to be coated, the adhesion of the release film is reduced at least in the region enclosed by the partition line, but preferably completely, in step e). This reduction can also be carried out directly after the application of the coating, however.

Subsequently, the release film, which is reduced in its adhesion, together with the coating located over it, which is partitioned from the coating in the coating region, is lifted off in a step f). The desired structured coating remains in the coating region, while the region which is not to be coated is exposed again. The method can be carried out so that the coating in the region which is not to be coated is lifted off completely and without residue.

The method has the advantage that any coating can be structured and at the same time, independently of the adhesion to the surface, can also be removed again easily over sensitive surfaces or structures, without damaging the sensitive surface in this case. These surfaces are protected by the release film during the application and the structuring of the coating. It is thus possible to lift off even solidly adhering coatings without problems.

The release film used in the method can be glued or laminated onto the surface.

Films, which are known in particular as UV release tape or as thermal release tape, can be used as release films. Depending on the type of the release film, the adhesion thereof on surfaces can be reduced by the action of UV light, by means of laser, or by thermal action. In this case, the chemical or physical properties of the release film are permanently changed at least in the region of the interface at which the release film adheres on a surface. By way of the action, chemical bonds can be broken or reactive groups, which are particularly responsible for the adhesion, can be converted into less reactive or in particular less polar groups. It is also possible to change the physical consistency at the interface and, for example, melt, foam, or vaporize a layer. Such release films are already known for the temporary fixing of semiconductor wafers, which must then be lifted off of the release film again after a processing step.

Films which are appropriately coated, so that the adhesion thereof may be reduced or canceled out entirely by the mentioned means, can also be used as release films. It is also possible to first apply a separating layer onto the surface which is not to be coated and then a normal film above it. The separating layer may be decomposed or detached by the action of light or heat.

However, it is also possible to apply an intermediate layer to the surface as the release layer, which, upon melting, foaming, or vaporization, separates from the surface, which is not wettable, for example, a vapor-deposited tin layer. In all cases, the release film can have multiple layers, wherein preferably the lowermost layer of the release film is the one in which the adhesion or structural integrity can be reduced or degraded by the mentioned means.

In general, a ratio of the adhesion before and after the reduction thereof by the release step of at least 5:1, preferably higher than 10:1 is desirable.

A typical layer thickness for a release film is in the range of 1 μm to 200 μm, but can also be greater or less depending on the application and intended use. If the release film is used to span a free space between two components or a recess in a surface, the thickness thereof is to be selected as appropriately high to maintain sufficient mechanical stability.

In one embodiment, the structural element on which the structured coating is applied is part of an assembly or a module, which has one or more MEMS components and one or more chip components. These components are arranged on a carrier. The structural element to be coated can be one of these components or the entire assembly or the entire module.

The application of the coating according to the proposed method can be performed so that the coating seals off each individual one of the components or the components as a whole as an assembly or module from the carrier. Using the method, a structured coating is then created, which has a media access to the assembly and in particular to the MEMS component in the region which is not to be coated.

The media access is required for all such MEMS components, which have to come into direct contact with the surroundings for the function thereof. The media access therefore provides a free channel toward the micromechanical structures of the MEMS component, for example, a membrane, which is suitable as a sound channel, for pressure equalization, or for the entry of ambient media to determine a parameter of the medium.

Films are suitable as the coating. The coating can be applied over the assembly or the module so that it spans intermediate spaces between the components. The coating can also be applied so that the film, with sufficient spacing between the components around individual ones or around one or more subgroups of the assembly, can be drawn down to the surface of the carrier and can be sealed off with the surface of the carrier there.

The coating can comprise multiple partial layers, which can be applied jointly or sequentially. A partial layer can also be metallic.

The release film can, in one embodiment, already be applied and structured on the MEMS wafer, on which a plurality of MEMS components are processed in parallel. In particular, in this case the adhesion of the release film in relation to the surface can be reduced in the coating region and the release film can subsequently be removed in precisely this region. The individual MEMS components are then only isolated after the structuring of the release film on the MEMS wafer.

The individual MEMS components are mounted on a carrier, optionally together with a chip component, so that each assembly is equipped with these components on the carrier. The further method steps are first performed subsequently, comprising the application of the coating, the reduction of the adhesion in the region which is not to be coated, and the lifting off of the release film together with coating applied above it in the region which is not to be coated.

This method variant has the advantage that the structuring step omitted on the release film can be carried out in a manner which saves time and costs at the MEMS wafer level. This method variant is suitable in particular for thermally stable release films, the adhesion of which can be reduced in another manner, in particular by UV action. On the other hand, during the equipping of the carrier with the components and in particular with the MEMS component, a method has to be selected which can be carried out at lower temperature. A release film can then also be used, which can be thermally reduced in the adhesion thereof.

In one embodiment, for the structuring of the release film, incisions are created in the release film along first partition lines around the region which is not to be coated. Subsequently, the release film is removed in the coating region which lies outside the region enclosed by the partition line. In this procedure, it is possible to draw off the release film in the coating region in one piece, without prior reduction of the adhesion. This is always possible if the release film in the coating region does not adhere to sensitive surfaces, which could be damaged during the drawing off of the release film. The drawing off can also be made easier in that the release film is only fixed on the surface in the critical region circumferentially around the region which is not to be coated. This is possible in particular in a simple manner if the region which is not to be coated is provided on the surface of the MEMS component and the MEMS component is the component within the assembly which has the greatest height above the carrier. In this manner, it is possible to apply the release film in method step a) so that it predominantly or exclusively adheres to the surface of the MEMS component.

However, it is also possible to reduce the adhesion of the release film to the surface in the entire coating region and thus make it easier to remove the release film in the entire coating region.

The reduction of the adhesion of the release film on arbitrary supporting surfaces in selectively chosen regions is preferably performed by means of UV irradiation, wherein a UV release tape is used as the release film.

A locally-selective or structuring exposure can be performed by means of a mask. It is also possible to only scan using a light beam or laser beam over those regions of the UV release tape, in which the adhesive capability of the release film is to be reduced.

After the application of the coating, second incisions are created in the coating along a second partition line in method step d). These second partition lines can be led congruently with the first partition lines. However, it is also possible that the second partition line is led inside the area enclosed by the first partition line and preferably in parallel to the first partition line.

However, the second partition line can also be located slightly outside the area enclosed by the first partition line. For example, distances to the first partition line of up to five times the thickness of the coating or up to approximately 100 µm are possible. Therefore, in many cases simple lifting off of the coating can still be achieved in later step f).

In next step e), the adhesion of the release film is reduced in the region which is not to be coated by the use of corresponding means.

Subsequently, in step f), the release film, together with the partial region of the coating arranged above it is removed, i.e., within the second partition line(s) in the region which is not to be coated, in which it has neither adhesion to the supporting surface nor a connection to the solidly adhering region of the coating in the coating region. This can be performed in various ways and is dependent on how strongly the release film still adheres to the supporting surface in this region.

In particular using a thermal release tape, the adhesion of the release film to the supporting surface can be canceled out practically completely. In this case, it is even possible to blow off the region of the release film, which is cut out along the second partition lines, together with the coating above it. If a residual adhesion to the supporting surface still exists, the cut-out release film can thus be drawn off with a further adhesive film, which is provided with relatively little adhesive effect. It is also possible to perform the removal using other mechanical means or by suctioning off.

In one embodiment, the method is used for encapsulation of an assembly or a module, which comprises a MEMS microphone as a MEMS component, which is mounted inside an assembly on the carrier. In this embodiment, the recess above the microphone membrane of the MEMS component represents the region which is not to be coated, and which has to remain free of mechanical stress and other contamination during and after the coating method.

If the coating terminates at the edge of the assembly with the carrier, a further cavity, which accommodates the encapsulated assembly, can be enclosed and sealed off with the aid of a cover above the assembly. For this purpose, it is possible to either provide a flat carrier and to apply a mechanically stable cap thereon, which encloses a cavity under it after application, as the cover. Alternatively, it is possible to provide a trough-shaped carrier, in the trough of which the assembly is arranged. A flat cover can then be applied above it and can be connected to the carrier so that it covers the trough.

A further possibility is to provide a frame around the assembly on the carrier, at a height which is taller than the tallest component of the assembly. A flat plate can then be placed on the frame as a cover and fastened so that a tightly sealed cavity results.

The cap can be fastened using adhesive. It can be metallic, can comprise a sheet-metal molded part, can be manufactured in a galvanoplastic manner, or can comprise a metallized plastic part. To improve an electromagnetic shielding effect, the cap can be connected on the carrier to a ground potential. Soldering the cap or fastening it using electrically conductive adhesive then suggests itself.

In the case of a microphone or a structural element comprising such a MEMS component, at least one sound opening is provided in the cover or in the carrier. This can be performed before the MEMS component is applied to the carrier, before the cover is applied to the carrier, or after the cover or cap is applied to the carrier. In the case of subsequent creation of the sound opening, the access to the cavity under the cover or the media access to the microphone membrane is produced so that no contaminants are thus introduced into the cavity, which could disturb the function of the microphone membrane.

By providing a cover, a first volume between membrane and carrier can be sealed off using the coating from a second volume between the membrane or the coating and the cover.

The first sealed-off volume also preferably comprises at least one intermediate space between MEMS component and chip component. Further volumes which correspond and/or are connected to one another can be formed by intermediate spaces between and below the components, in particular if the components are applied at a distance to the carrier, for example, via bump connections, which, as quasi-spacers, maintain the volume between the carrier and at least one of the components.

In one embodiment, a film which can be deep drawn is applied over the assembly as the coating. Such a film has plastic properties in particular at elevated temperature. By way of the combined use of pressure and temperature, for example, in an autoclave, it is possible to laminate on such a film, which can be deep drawn, over assembly and carrier and at the same time to produce an intimate contact of the film to the surface of the components forming the assembly.

The film which can be deep drawn can comprise an elastic component, which guarantees the desired mechanical properties, in particular sufficient plastic deformability, at the application temperature. The film which can be deep drawn preferably comprises a further component, which may be cured to form a through-hardened thermosetting plastic. It is also possible that the film comprises a polymer in the B state, which already has a small degree of cross-linking and can be converted after the lamination into a cured state having stable mechanical properties. The coating loses the deformability due to curing, so that a mechanically stable coating which is fixedly seated on the carrier and the assembly is obtained.

A lamination film suitable for the coating can advantageously have a thickness of 10 µm to 200 µm.

The coating can soften during the application method so that it clings tightly to each individual component of the assembly, but at least on the side and from above. To ensure that the volume formed by intermediate spaces between components of the assembly is uncontrollably reduced by penetration of the film used as the coating, in one embodiment, the release film can be used for the mechanically stabilizing cover of such intermediate spaces. For this purpose, the release film is also left during its structuring in those regions on the assembly in which it is to exert a supporting function for the coating applied thereon, in particular just in a bridge region above the intermediate space between two components. The release film is not removed in the bridge region and is preferably also not reduced in the adhesion. Therefore, it can support the coating in the bridge region and prevent sinking of the coating into the intermediate space during the coating.

In one embodiment, a thermal release tape is used as the release film, the application of which is first performed after the mounting of the components on the carrier. This avoids the release film from already being reduced in the adhesion as components are soldered on. The structuring of the release film according to method step b) can then be performed thermally, wherein the thermal energy required for reducing the adhesion can be introduced via a laser. After the application of the coating, the adhesion of the entire remaining release film can then be reduced by thermal action by means of placement of the assembly on a hot plate, by IR irradiation, or by action using a hot air blower. This thermal release can be performed before the creation of the second incisions. The drawing off of the coating can then be performed in the region which is not to be coated.

To increase the mechanical stability, to improve the hermetic seal, and to improve the electromagnetic shielding, after the application, the coating can be reinforced over the entire area or partially by a metallization, which is applied over the coating. Such a reinforcement can be performed in two steps, wherein in a first step, a base metallization is created, for example, by sputtering, vapor deposition, or treatment using a nucleating solution. The base metallization can be reinforced in a galvanic or currentless method from a solution. It is also possible to cause the reinforcement of the base metallization by applying metal particles, optionally with thermal post-treatment. The metal particles can be sputtered on or in particular applied using a jet printing method. It is also possible to reinforce the metallization by melting on a metal foil, wherein a low-melting-point metal foil is used.

The metallization can be created up to a thickness which is sufficient to create a sufficient mechanical stability of the coating above the assembly.

In one embodiment, the coating resting directly on the carrier is removed except for an edge region, which is adjacent to the assembly and completely encloses it. The coating still terminates closely with the carrier in the entire edge region. Thus, the metallization optionally applied thereon can also be terminated with the carrier and a hermetic closure of the assembly is obtained. A cap is also optionally subsequently placed on the region of the carrier freed from the coating and is preferably glued to the carrier.

In one embodiment, a MEMS microphone is mounted by means of flip-chip technology on the carrier as the MEMS component. For this purpose, solder beads, gold stud bonds, or alternatively also drops of an electrically conductive adhesive are suitable.

In one embodiment, after the coating, the assembly is provided with a cap, in which a sound opening is provided, as a cover. The sound opening is placed in this case so that it is arranged above an intermediate space between two components. By means of a seal, which is provided between sound opening and the coating in the region above the bridge region, a connection, which is used as a sound channel, to the first volume under the coating in the region of the intermediate space can be provided through the sound opening. The sound channel is therefore also in communication with the volume below the microphone membrane.

As a seal, a sealing means is provided between the cap and the coating applied over the assembly, which seals off from the inside with the cap at least in the region around the sound opening and with the coating in the bridge region. An opening is provided or is provided later in the sealing means, which is extended through the coating into the intermediate space. In this case, the mentioned continuous sound channel results through the sound opening, sealing means, and coating into the intermediate space and finally down to below the MEMS component or below the microphone membrane, respectively.

The sealing means can be applied as a viscous compound through the sound opening after the placement of the cap and can subsequently be cured. The sealing means can also be arranged above the intermediate space before the placement on the coating. A sealing ring made of an elastic material can also be used as the sealing means, which is arranged on the coating above the intermediate space or at a corresponding point in the cap/cover. The sealing ring is dimensioned so that it is fixedly clamped between coating and cover and can thus unfold its sealing action upon the placement of the cap or the cover.

In all structuring steps, it is advantageous to acquire and store the geometry data of wafer and equipped or unequipped carrier, so that the structuring can be performed in a precisely fitted manner using these data. Location and manufacturing tolerances can thus be compensated for.

The invention is explained in greater detail hereafter on the basis of exemplary embodiments and the associated figures. The figures are only schematic and are not shown to scale, so that neither absolute or relative dimension specifications can be inferred therefrom. Individual parts can be shown enlarged.

FIGS. 10 to 14 show various further embodiments of structured coated assemblies and structural elements provided with a structured coating.

FIGS. 15a and 15b show structural elements having a metallically reinforced structured coating.

FIG. 1 shows a schematic cross section of a structural element BE, on the surface of which a release film RT is applied. The release film adheres in the illustrated example to the entire surface of the structural element BE.

Figure 1:
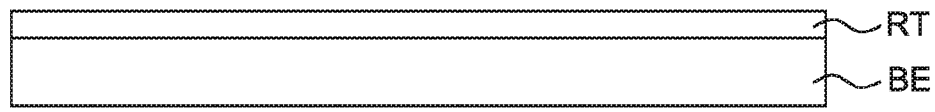
FIGS. 1 to 8 show a simple exemplary embodiment of different method steps during the production of a structured coating.
Figure 2A:
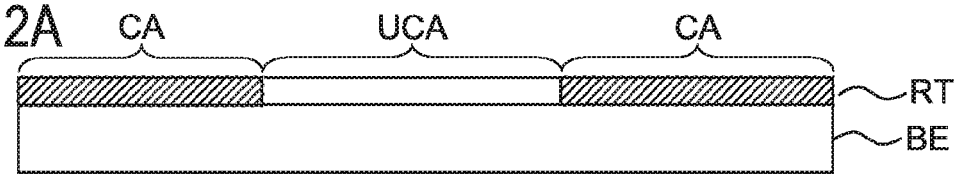

A coating region CA and a region UCA which is not to be coated are now defined in the release film RT. Optionally, the adhesion of the release film RT to the surface of the structural element BE can be reduced in the coating region CA. Depending on the type of the release film, this can be performed by thermal action or by light/UV action. The release film in the region CA to be coated then has only slight adhesion or no adhesion at all on the surface of the structural element BE, but still has structural integrity, see FIG. 2A.

Figure 2B:
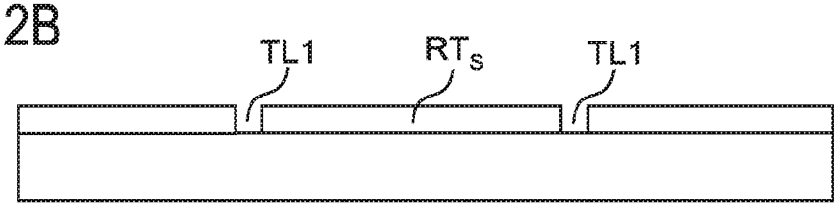

Alternatively or subsequently to this step, first incisions are created along a first partition line TL1, in which the release film RT is substantially or completely severed and/or removed. The first partition lines are led so that they enclose the region UCA, which is not to be coated, in the form of a closed line. FIG. 2B shows the first partition lines TL1 around the region UCA which is not to be coated, without the adhesion of the release film RT being reduced in the coating region.

Figure 3:
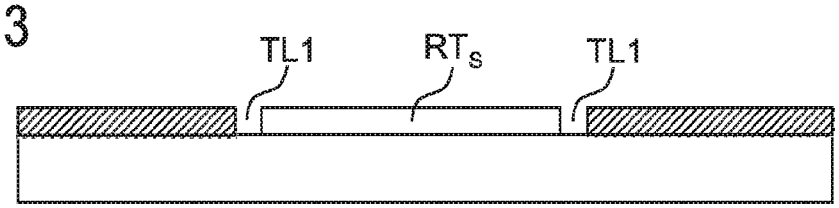

It is also possible to first create the first incisions to define the coating region (see FIG. 2B) and only then reduce the adhesion in the coating region CA. FIG. 3 shows the arrangement at this method step.

Figure 4:
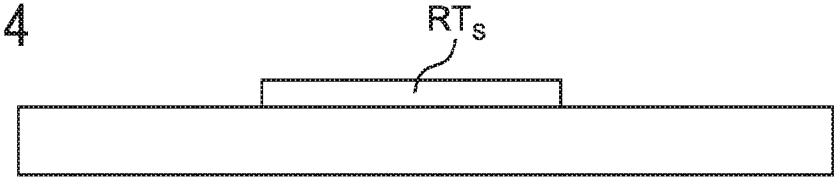

In the next step, the release film is removed in the coating region CA, so that a part of the release film $RT_s$ only remains on the surface of the structural element BE in the region UCA, which is not to be coated. The removal of the release film can be performed by drawing off. FIG. 4 shows the arrangement at this method step.

Figure 5:
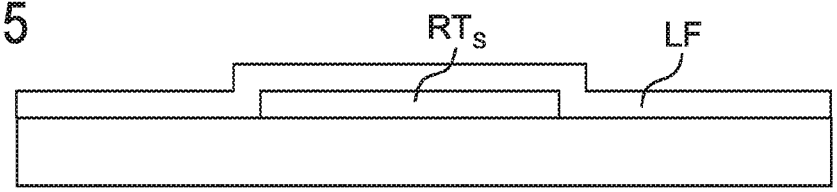

FIG. 5 shows the arrangement after the application of a coating LF, which is applied over the entire surface of the structural element and over the remaining structure $RT_s$ of the release film RT. The coating preferably rests over the entire area and can comprise greatly varying materials. The coating can comprise a layer or a layer sequence applied in the thin-film method. The coating can comprise organic layers, for example, resin layers, films, and inorganic insulation layers which are vapor deposited, sputtered on, or deposited by means of CVD methods. Metal layers can also be applied as the coating or as a partial layer of the coating.

Figure 6:
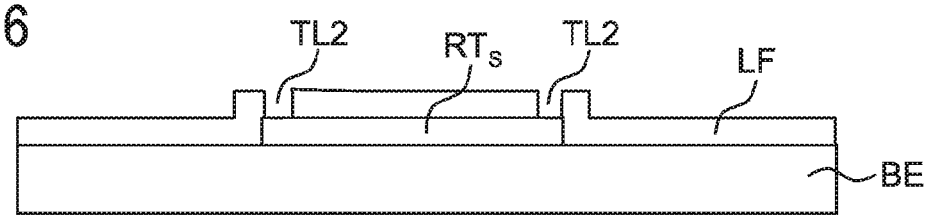

For the structuring of the coating LF, the coating LF is now substantially or completely removed along second partition lines TL2, which are led essentially parallel to the first partition lines TL1 and are arranged in the edge region of the region UCA, which is not to be coated. The incisions are led so that the remaining release film structure $RT_s$ is exposed therein. FIG. 6 shows the arrangement at this method step. However, it is also possible that the release film $RT_s$ is also still removed along the second partition lines TL2 (not shown in the figure). The second partition line TL2 can also be led just outside the remainder of the release film $RT_s$. A bead formation on the structuring edge of the coating can thus be avoided.

Figure 7:
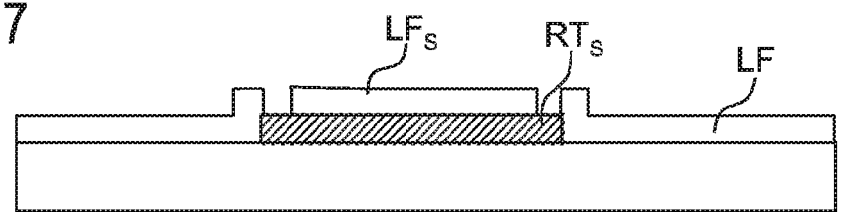

In the next step, the remaining structure RTS of the release film is completely reduced in the adhesion thereof, which can again be performed thermally, by means of light, or UV, corresponding to the previously executed step. In FIG. 7, the remaining release film structure $RT_s$, which is reduced in the adhesion, is indicated by shading.

It is also possible to exchange the last two steps and firstly to reduce the adhesion of the release film structure $RT_s$ and subsequently to perform the severing along the second partition lines TL2.

Figure 8:
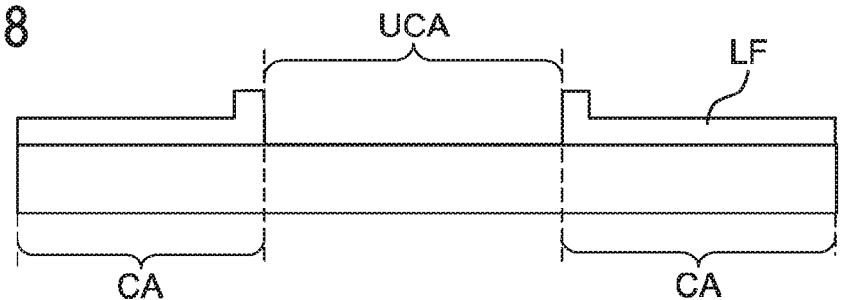

In the next step, the release film structure $RT_s$ which is reduced in the adhesion is lifted off together with the region of the coating $LF_s$ applied over it. Depending on the release film used and depending on the method for reducing the adhesion of the release film, forces of different strengths are required for this purpose. If the adhesion is completely canceled out, blowing or suctioning off can be sufficient. However, it is also possible to draw off coating and release film structure by means of an adhesive film, which has a stronger adhesion than the remaining adhesion of the release film on the surface of the structural element. FIG. 8 shows the arrangement at this method step, therefore a structural element which, in a coating region CA, has a coating LF, which is removed in the region UCA, which is not to be coated, and exposes the surface of the structural element BE therein. The proposed structuring method is particularly suitable for those structural elements which have a sensitive surface in the region which is not to be coated, for example, sensitive structural element structures arranged therein. Using the proposed method, coatings on such surfaces can be carefully removed and therefore structured.

In a special application, the coating method is used on the surface of a structural element BE, which has recesses AN. Sensitive structures can be arranged on the bottom of the recesses. In particular, the structural element BE is a MEMS structural element, which has MEMS structures on the bottom of the recess, in particular a membrane, as is used in MEMS microphones or pressure sensors.

Figure 9A:
FIGS. 9a to 9k show various method steps during the production of the coating by means of a UV release tape.

The coating method is then advantageously carried out at the wafer level. In this case, a plurality of structural elements are processed in parallel on a MEMS wafer. FIG. 9a schematically shows an example of such a MEMS wafer having a plurality of recesses AN as a structural element BE having recesses AN or cavities.

Figure 9B:
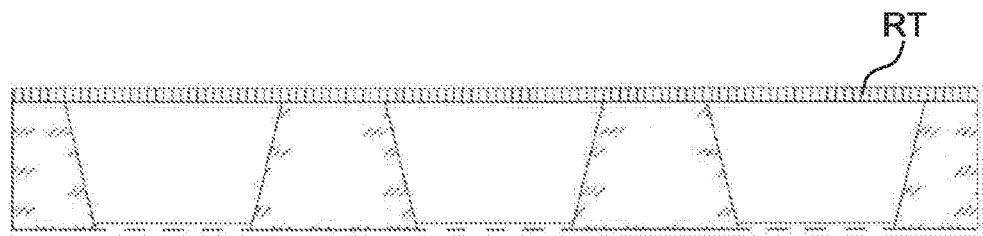

In the next step, a release film RT is applied to the surface of the MEMS wafer BE, which comprises a plurality of MEMS structural elements, so that the release film RT spans the recesses. The adhesion of the release film to the surface of the structural element BE or the MEMS wafer can be reinforced by pressure and/or temperature, in particular by a lamination method. FIG. 9b shows the arrangement at this method step.

Figure 9C:
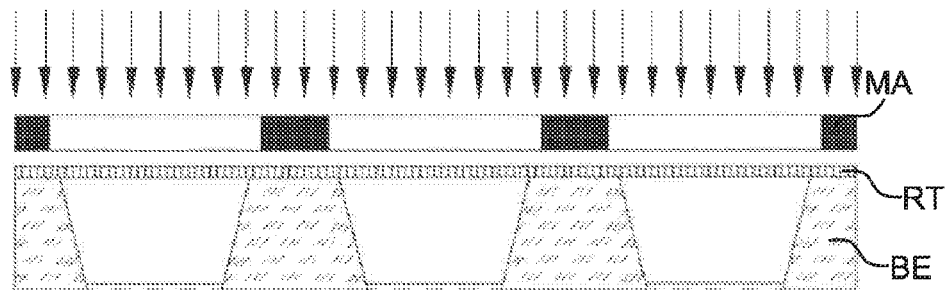

In the next step, the adhesion of the release film RT is reduced in the region CA to be coated, which is preferably performed in the present example by the action of UV radiation (indicated in FIG. 9C by corresponding arrows). The exposure can be carried out in a structuring manner via a mask MA, which is only light-transmissive at the regions to be exposed. Alternatively, the exposure can be carried out in a scanning manner using a laser beam. The exposure is performed so that the release film RT is reduced in the adhesion in a region around each recess, wherein an edge region of differing width remains between the exposed region and the edge of the recess, in which the release film adheres well to the surface of the structural element BE. Alternatively, an inverse principle can also be applied, in which the adhesion of the release film is increased by irradiation. The regions are then to be irradiated, in which an adhesion of the release film is to be maintained at least over sections of the entire method. Such regions can be located in the region of the partition lines, in which severing and therefore detachment from the surface takes place.

Figure 9D:

In one step (not shown), the release film RT is severed between the coating region and the region which is not to be coated. Subsequently, the release film RT is removed in the region in which the adhesion thereof is reduced. FIG. 9D shows the arrangement at this method step. The remaining release film structures RTS cover the recesses AN and close them.

Figure 9E:
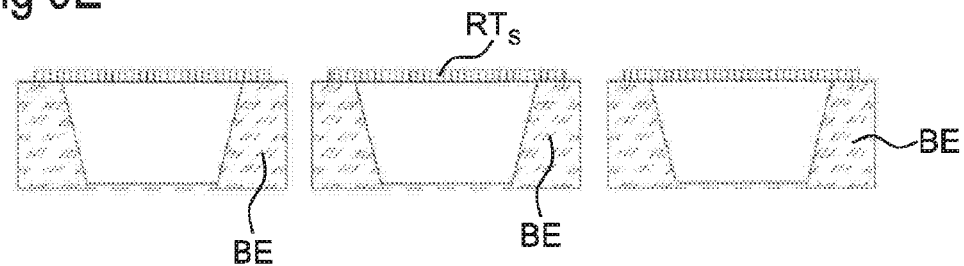

In the next step, the structural elements BE can be isolated, in that cuts are led into and through the MEMS wafer between the individual structural element regions, for example, by sawing. The MEMS structures are protected in the interior of the recesses AN in relation to the severing processes by the remaining structure of the release film RTS. Thus, neither moisture, sawing dust, nor other liquids or particles, which arise during the severing, can contaminate the structural element BE. FIG. 9e shows MEMS structural elements BE isolated in this manner.

Figure 9F:
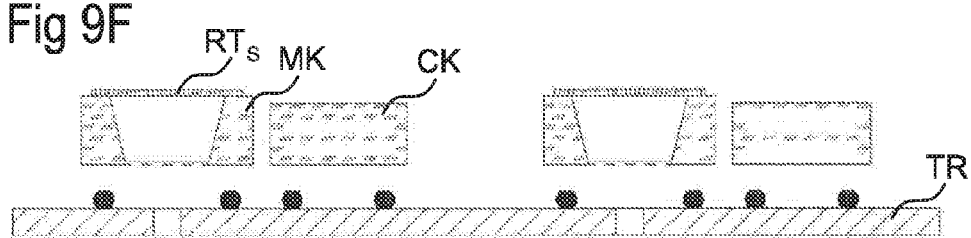

FIG. 9f: The isolated MEMS structural elements BE, which are protected using the release film structure RTS, can now be further processed individually. For this purpose, they are placed on a carrier TR and connected electrically and mechanically thereto. Organic or inorganic multilayer laminates (for example, glass fiber/epoxy of the category FR4, HTCC, LTCC, or other materials) are suitable as the carrier. Further structural elements can be arranged on the carrier, which are required for a desired assembly. The carrier TR can also represent a composite substrate, on which a plurality of modules or assemblies can be processed in parallel.

Figure 9G:
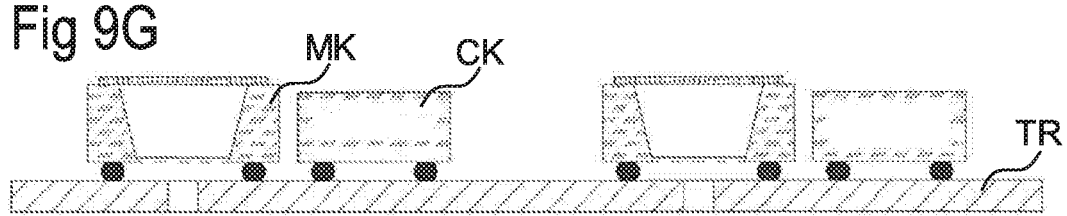

For this purpose, a further chip component CK is provided in an exemplary manner in the assembly or the module adjacent to the structural element (the MEMS component MK here), which together form an assembly, in FIG. 9f. Of course, the assembly can comprise still further components. FIG. 9g shows the arrangement with mounted components.

In the next step, a coating LF is now applied over the assemblies and the exposed surface of the carrier TR in between so that it terminates flush with the surface of the carrier in an edge region around the assemblies. The coating preferably clings to the surfaces of all of the components and also encloses them laterally. Narrow intermediate spaces between installed components of an assembly can also be spanned by the coating.

Figure 9H:
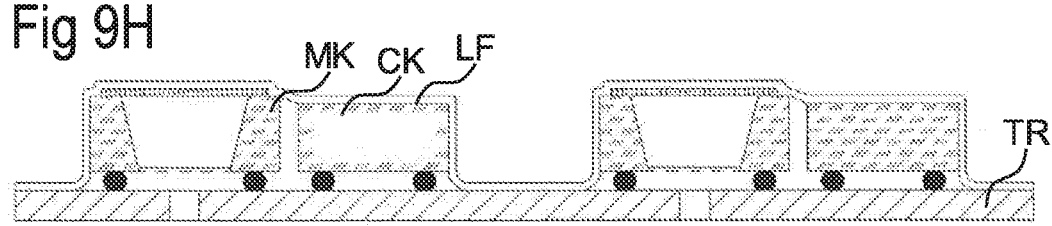

A coating method for producing such a clinging coating is, for example, a lamination method, wherein a lamination film is used as the coating. A lamination-capable film can be a thermoplastic film, but preferably a thermally deformable adhesive film, which may be cured in a later step. FIG. 9h shows the arrangement at this method step.

In this method variant, the remaining release film structure RTS over the recesses is used so that the coating LF cannot penetrate into the recesses and come into contact with the MEMS structures arranged on the bottom of the recess or even damage them and obstruct them in the function. This is achieved by a release film which has a higher mechanical stability than the coating LF under the conditions of the coating method.

Figure 9I:
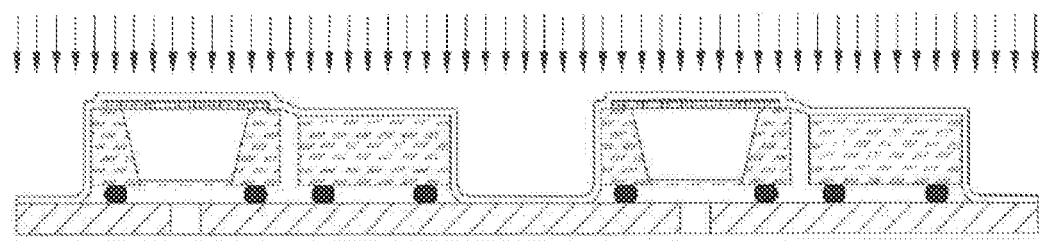

For the function of the MEMS component MK, it is necessary here to remove the release film RT together with the coating LF arranged over it over the recess AN, to create free access to the MEMS structures on the bottom of the recess. For this purpose, the adhesion of the remaining release film structure is reduced in a first step. In FIG. 9I, this is indicated by the action of radiation. However, it is possible to also reduce the adhesion by thermal action.

Figure 9J:
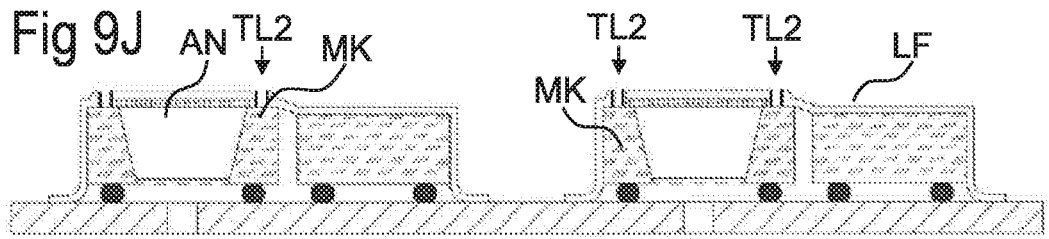

In the next step, the coating LF is removed along second partition lines TL2. A direct structuring method suggests itself for this purpose, for example, laser structuring. The second partition line TL2 is led so that it meets the edge of the MEMS component MK bordering the recess and at the same time leaves sufficient distance to the outer edge of the MEMS component and to the outer edge of the recess AN. The second partition line TL2 can be led congruently with the first partition line TL1 and defines the region UCA which is not to be coated, in which the release film is removed together with the coating RTS applied over it. However, it is also possible to preferably offset the second partition line inward, toward the recess AN, in relation to the first partition line, wherein the distance to the recess is always maintained, however. FIG. 9J shows the arrangement at this method step. The second partition line TL2 can also be led slightly further outward, however, as already explained above.

Figure 9K:
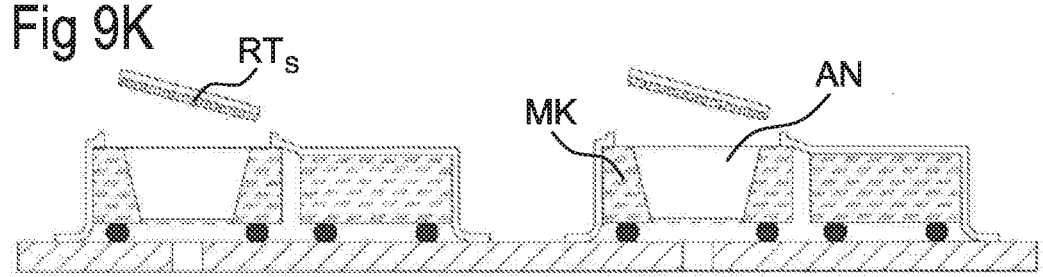
Figure 16:
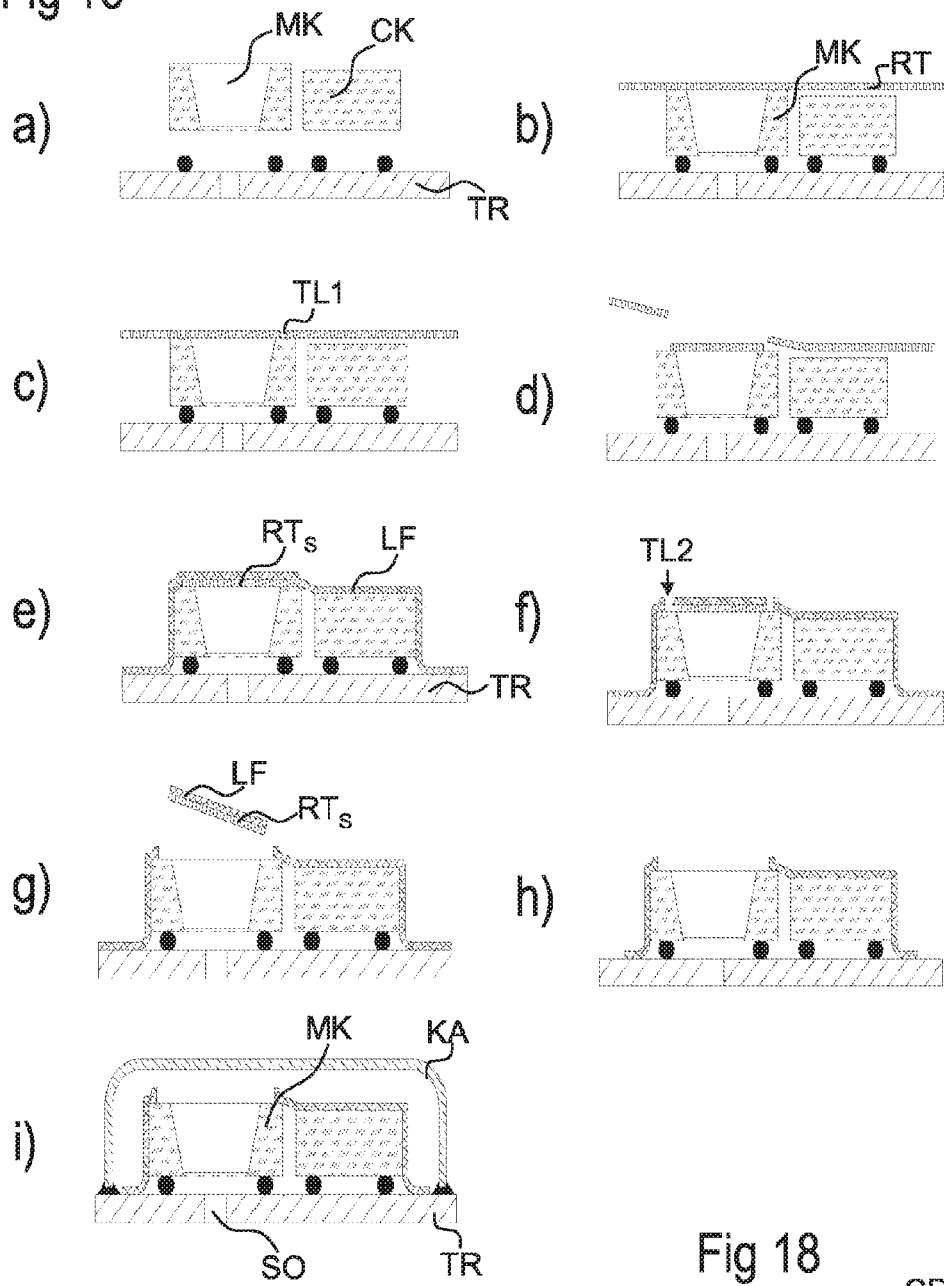
FIGS. 16a to 16i show various method steps of a method for producing a coating by means of a thermal release tape.

In the next step, the part of the release film RTS which is reduced in the adhesion is removed in the region UCA, which is not to be coated. Depending on the strength of the remaining adhesion, different methods are usable for this purpose. If the release tape has little to no adhesion to the MEMS component, in the extreme case, it rests loosely and can be blown away, for example. Alternatively, it can be drawn off with the aid of an adhesive film. FIG. 9k shows the arrangement during the removal of the release film RTS in the region which is not to be coated. The recess AN is now freely accessible from above, while the coating in the remaining region rests fixedly on the assembly and seals it off from the carrier TR. In this case, a volume is enclosed under the coating LF, which comprises all intermediate spaces between chip component, MEMS component, and carrier. In the region of the recess, the microphone membrane, which forms the bottom of the recess, closes off the enclosed volume.

The arrangement can now be additionally protected further, as shown in FIG. 10, in that a cap KA is placed on the carrier above the assembly covered with the coating, this cap leaving an intermediate space over the assembly, but terminating closely with the carrier TR. In this case, the interior under the cap KA encloses a further volume, which is delimited at the bottom by the coating LF and the membrane. The cap KA can be fastened using a connecting means, for example, an adhesive, to the carrier. A metallic cap can also be soldered on.

If the MEMS component MK is designed as a MEMS microphone, the two volumes, which are separated from one another, under the cap and under the coating now define front volume and back volume, wherein the assignment can be performed differently.

If the sound opening SO is provided in the carrier, the volume under the cap thus forms the back volume. FIG. 10 shows such an arrangement.

However, it is also possible to provide the sound opening in the cap KA, so that then the volume enclosed by the coating LF in relation to the carrier TR forms the back volume. FIG. 14 shows such an arrangement.

If the cap KA is applied over the assemblies on the carrier TR, an isolation of the assemblies can thus be performed in the next step. Mechanical methods, for example sawing, are suitable for severing the carrier between the individual caps or between the assemblies covered by the caps. However, other methods can also be used in dependence on the material of the carrier. FIG. 11 shows an isolated assembly.

FIG. 12 shows an assembly in which the coating LF between two components is drawn down to the surface of the carrier and terminates there with it. The volume enclosed between coating and carrier can thus be reduced by the intermediate spaces between the components. This is advantageous if this volume is used as the front volume and the sound opening is provided in the carrier as in FIGS. 11-13.

FIG. 13: In a method variant, a housing trough can be used as the carrier TR for the assembly, on the bottom of which MEMS and chip components can then be fastened so that the upper edges of the trough protrude above the upper edge of the components. The components are mounted on the inside on the bottom of the housing trough and provided as previously with a coating, which separates the assembly into a coating region and a non-coated region. The coating can be drawn in this case over the entire housing trough, so that it covers the lateral edges thereof.

In the next step, instead of a cap, a flat cover CR can then be applied to the edges of the housing trough so that the edges terminate all around with the flat cover and a volume is thus enclosed in the housing trough. The coating F drawn over the edges of the housing trough can be used in this case as a connecting means, in particular if the coating LF can be thermally softened or even becomes sticky. This structural element can be manufactured using a single housing trough. However, it is also possible to use a composite substrate, on which a plurality of housing troughs are already preformed. The mounting of the components and the application of the flat cover CR is then possible as an area process or in multiple panels.

FIGS. 15a and 15b show a further variant, in which the coating comprises at least two partial layers. A laminate film LF is applied as the first partial layer of the coating. A metal layer ML is deposited over the entire area over the laminate film LF as the second partial layer of the coating.

The metal layer ML can consist of a thin adhesion layer, which comprises titanium, and a reinforcement layer, which is several micrometers thick, made of copper deposited in a currentless or galvanic manner or of a nickel layer deposited by means of PVD.

In addition to laser ablation, wet chemical processes also suggest themselves for the severing and structuring of the metal layer, since in this case the structural element is protected by the coating from solvent, acid, or base attacks.

The components can be mounted on a flat carrier, but as shown in FIG. 15a, can be mounted on the inside at the bottom of a housing trough.

Both first partial layer (laminate film LF) and also second partial layer (metal layer ML) can be drawn over the side walls of the housing trough. Lifting off a coating comprising a metal layer ML can also be performed as shown on the basis of FIG. 9k, for example, by severing along second partition lines around the recess on the MEMS component.

FIG. 15b shows the arrangement after the housing trough has been covered with a flat cover CR and fixedly connected by a bonding method, for example, gluing.

FIGS. 16a to 16i show a further method variant, in which a thermal release film is used as the release film RT. A suitable release film is, for example, REVALPHA™ from Nitto Denko. Because of the thermal sensitivity of the release film, this method variant differs in that chip and MEMS components CK, MK are first mounted on the carrier TR, before the release film is applied. A premature release due to thermal processes during the mounting of the components is thus avoided. The carrier is preferably of large area and it enables the mounting of numerous components and therefore the parallel processing of multiple structural elements simultaneously. After the mounting, the thermal release film RT is applied over the two components. If the components have different heights, as shown in FIG. 16, the release film RT can thus only be applied to the component protruding farthest above the carrier, which is typically the MEMS component MK. The release film RT does not lay upon the chip component CK.

As shown in FIG. 16c, the release film is now severed along first partition lines TL1 and drawn off beyond the partition lines in the region to be coated as a coherent film. FIG. 16d shows the arrangement during this step.

In the next step, as heretofore (see also FIG. 9a and hereafter in this regard), a coating LF is applied over the entire area over chip and MEMS components so that it circumferentially seals off the assembly with the carrier TR, as shown in FIG. 16e.

The coating LF is subsequently severed, as shown in FIG. 16f, along second partition lines TL2 corresponding to the structuring of the release film RT. After the severing, the release film, together with separated coating LF applied over it, is removed in the region not to be coated, as shown in FIG. 16g. To make it easier to draw off the release film in the region which is not to be coated, after creating the incisions along the second partition lines TL2, the adhesion of the release film is preferably reduced over the entire area, in that the entire arrangement is subjected to an elevated temperature, which is sufficient to reduce the adhesive forces of the release film on the MEMS component MK. A suitable temperature/time profile is set for this purpose, which can be carried out in a furnace and/or on a hot plate and/or under an infrared radiator. The release step can also be combined in this manner with the curing of the laminate film LF used for the coating.

FIG. 16g: The lifting off of the release film RTS together with coating LF located over it is performed more simply using the thermal release film, since the adhesive forces thereof may be almost completely canceled out.

FIG. 16h: As the finished structural element, chip and MEMS components remain on the carrier, which are covered with the coating LF from the carrier. The recess in the MEMS component above the membrane or the other functional layer on the bottom of the MEMS component is exposed by removal of release film and coating in this region which is not to be coated and therefore the access to the functional layer or to the membrane of the MEMS component MK is freely opened.

Subsequently, a cap KA is placed over chip component and MEMS component and connected to the carrier TR so that a volume is enclosed under it. FIG. 16i shows such a finished structural element, in which the sound opening SO is provided below the MEMS component MK in the carrier TR.

Figure 17:
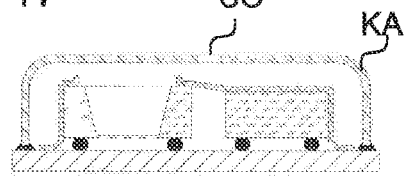
FIG. 17 shows a further variant of an encapsulated structural element having a cap-shaped cover.

FIG. 17 shows a variant in which the sound opening SO is provided in the cap KA.

Figure 18:
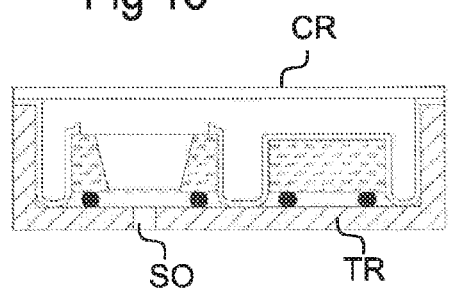
FIG. 18 shows a structural element having a structured coating and a flat cover over a trough-shaped carrier.

FIG. 18 shows a variant in which, instead of a cap, a flat cover CR is placed on a carrier TR formed as a housing trough and the housing trough is thus closed.

FIGS. 19a to 19d show various method steps in a method variant which enables the function of the two enclosed volumes to be exchanged. The starting point is a structural element in which a chip component CK and a MEMS component MK are mounted on a carrier TR and are covered by means of a coating LF from this carrier and as it was already illustrated and described in FIG. 14 or FIG. 17, for example. In this variant, the cap KA, which covers the components on the carrier, has a sound opening SO. In contrast to the preceding variants, however, the sound opening is not centered over the recess of the MEMS component, but rather above an intermediate space between two components, for example, over the intermediate space between chip component and MEMS component.

Figure 19A:
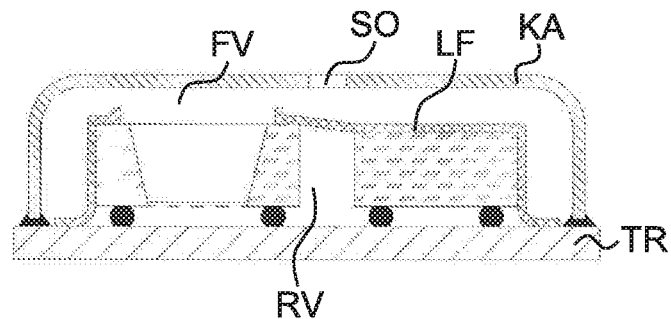
FIGS. 19a to 19d show various method steps during the production of a sound channel in an encapsulated structural element having a MEMS microphone.
Figure 19B:
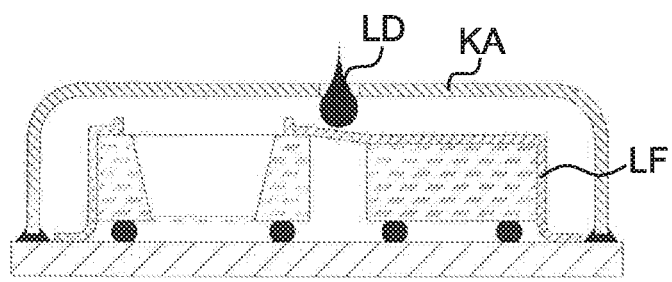
Figure 19C:
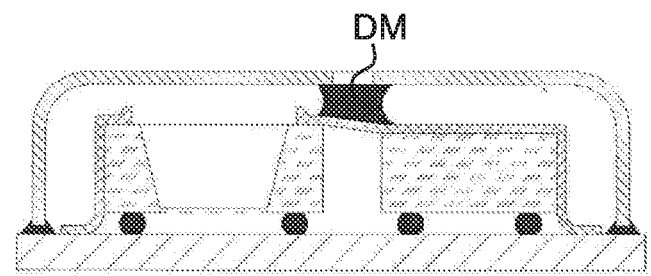

In FIG. 19a, the volume between the coating LF and the cap KA represents the front volume FV. To convert the front volume into a back volume, the sound opening must be sealed off from the previous front volume. For this purpose, as shown in FIG. 19b, a sealing means DM is introduced between cap KA and coating LF and applied as a liquid sealing means LD, for example, as shown. This can be performed by means of jetting, dispensing, needle transfer, or similar methods. FIG. 19c shows the arrangement in this method step, in which the sound opening is closed from the inside using a plug DM made of the sealing means, which simultaneously also seals off toward the coating LF.

Figure 19D:
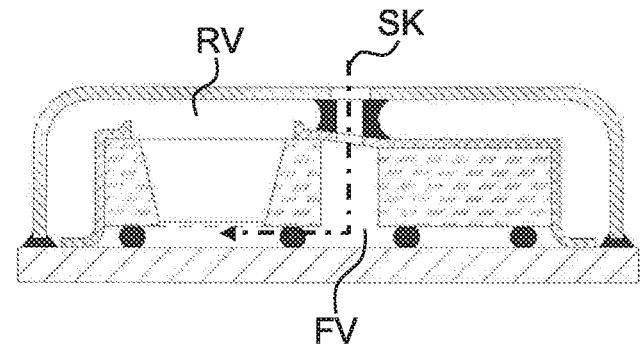

An access to the previous back volume is now provided through the sound opening SO and the plug, or the sealing means DM. For this purpose, an opening is created through the sealing means DM and the coating LF located underneath. A drilling method, in particular a laser drilling method, is used for this purpose. As a result, a sound channel SK is created, which, as shown in FIG. 19d, opens an access through the sound opening SO to the volume between MEMS component and chip component and between the components and the carrier TR. Since the sound channel is sealed off from the volume RV between coating and cap, the sound channel opens the access to the front volume FV, while the other volume is used as the back volume.

The sealing means can be applied in liquid form and subsequently cured. It is possible in this case to influence the adhesion and/or the profile of the liquid sealing means on the surface of the coating LF before the placement of the cap. This can be performed by changing the surface properties, by increasing the roughness, or by applying a channel pattern especially in this region. It is also possible to create a flow barrier around the provided plug, to prevent further flowing of the sealing means before the curing. In this manner, it can be ensured that the liquid sealing means only flows to the desired extent and excessively strong flowing is avoided.

Alternatively, the arrangement shown in FIG. 19c can also be created in that, before the placement of the cap, the sealing means is applied to the coating above the intermediate space between chip and MEMS components in liquid form or as a rubber-elastic sealing means (ring or plug). A compressible foam can also be used. The cap KA is subsequently placed so that it presses with sufficient force against the sealing means and thus a good seal is produced between cap and coating over the intermediate space. It is also possible to create the arrangement shown in FIG. 19d in that a ring-shaped seal is placed or fastened, before the placement of the cap, in the region of the later sound channel. The cap preferably also presses sufficiently strongly against the sealing means formed as the sealing ring, so that the sound channel SK is also sealed off tightly from the later back volume RV here.

In the two last-mentioned method variants, in which the sealing means is applied before the cap, the sound opening can also be created in the cap KA after the placement of the cap. However, the method is preferred in which the sealing means is applied through the existing sound opening, since it is self-adjusting.

It is also possible in this method variant to use a trough-shaped carrier and then to arrange the sealing means between the coating and the flat cover.

The method for producing and structuring a coating, which is described on the basis of several exemplary embodiments, is therefore not restricted thereto. Rather, using the method, coatings can be created and structured on arbitrary surfaces or structural elements, in which either a recess is temporarily spanned by a coating in the structural element or in which a coating has to be carefully removed in the region of sensitive structures.

LIST OF REFERENCE SIGNS

BE structural element
CA coating region
UCA region which is not to be coated
RT release film
LF coating (for example, laminate film)
TL first and second partition line (around CA)
TR carrier
MK, CK MEMS or chip components
MW MEMS wafer
MM microphone membrane (in MK)
AN recess (above the microphone membrane)
KA cap over assembly on carrier
CR cover
SO sound opening (in cover or carrier)
ZR intermediate space (between two components)
MA mask
ML metal layer/metallization
DM sealing means
FV front volume
RV back volume
DR viscous compound which may be cured to form an elastic material
SK sound channel (formed by SO, opening in DM and in LF, intermediate space between components and between MK and TR)

The invention claimed is:

1. A method for applying a structured coating to a structural element with a surface having a coating region and an uncoated region, comprising:
   a. wherein a release film is applied to the coating region of the structural element and is at least partially fixed inside the uncoated region,
   b. wherein the release film is removed from the coating region,
   c. wherein a coating is applied over the entire area over the release film and the surface of the structural element,
   d. wherein the coating is severed circumferentially around the coating region along a second partition line,
   e. wherein the adhesion of the release film is reduced at least in the region enclosed by the second partition line,
   f. wherein the release film together with the coating applied over the release film is lifted off in the uncoated region.

2. The method according to claim 1, wherein a UV release tape or a thermal release tape is used as the release film and the adhesion of the release film is reduced in method step e) by means of UV light, laser, or by thermal action.

3. The method according to claim 1, wherein the structural element is part of an assembly having one or more MEMS or chip components that are arranged on a carrier, wherein the structural element represents one of MEMS or chip components, wherein the release film is applied over the entire area over the assembly as the coating so that the release film either seals off each of the MEMS or chip components or the components as a whole as an assembly from the carrier, wherein a media access to the MEMS component is provided in the uncoated region.

4. The method according to claim 3, wherein in method step a), the release film is applied to a MEMS wafer, in which a plurality of MEMS components are processed in parallel, wherein method step b) is then carried out, wherein the MEMS components are singulated, wherein subsequently the assembly is equipped with at least one of the MEMS components and at least one chip component, wherein subsequently method steps c) to f) are carried out.

5. The method according to claim 1, wherein in method step b), incisions are created in the release film along a first partition line around the uncoated region and the release film is removed in the coating region outside the region enclosed by the first partition line, wherein then the coating is applied, wherein the adhesion of the release film is first reduced thermally or by the action of UV radiation in the entire uncoated region in method step e) and then second incisions are created in the coating in method step d) along the second partition line.

6. The method according to claim 1, wherein the structural element is a MEMS microphone, which is mounted alone or in an assembly on a carrier, wherein, in method step f), a recess is exposed above a microphone membrane in the microphone in the uncoated region, wherein a cover is fastened on the carrier over the MEMS microphone or the assembly so that a cavity which accommodates the MEMS microphone or the assembly is enclosed and sealed off under the cover, wherein for this purpose either a flat carrier is used and a cap is applied thereon as a cover, or wherein a trough-shaped carrier is used and a flat cover is applied over it, wherein a sound opening is provided in the cover or the carrier.

7. The method according to claim 6, wherein a volume above the microphone membrane is sealed off from a volume below the membrane using the coating, wherein the volume over the membrane comprises the remaining cavity above the coating and under the cover, wherein the volume below the coating and below the microphone membrane comprises at least one intermediate space that is sealed by the coating to the carrier between MEMS and/or chip components.

8. The method according to claim 6, wherein, in method step c), a film which can be deep drawn is applied over the assembly as the coating.

9. The method according to claim 3, wherein, in method steps b) and f), the release film is not removed in a bridge region above the intermediate space between two components of the assembly, wherein, during and after method step c), the release film remaining in the bridge region supports the coating above the intermediate space.

10. The method according to claim 3, wherein a thermal release tape is used as the release film after the mounting of the components on the carrier, wherein, in method step e), the adhesion of the entire remaining release film is reduced by thermal action, wherein the lifting off of the release film together with coating applied over the release film in the uncoated region is achieved by blowing off, suctioning off, or by drawing off using an adhesive film.

11. The method according to claim 3, wherein, in method step c), a film which can be deep drawn and thermally cured is applied over the assembly as the coating.

12. The method according to claim 6,
wherein the coating on the carrier is removed except for an edge region that is adjacent to the assembly and completely encloses the assembly, wherein the coating terminates closely with the carrier in the entire edge region,
wherein the cap is placed on the region of the carrier free from the coating and is glued to the carrier.

13. The method according to claim 6,
wherein the MEMS microphone is mounted according to flip-chip technology on the carrier,
wherein the sound opening in the cap is provided above an intermediate space between two components,
wherein, between the cap and the coating over the assembly, a seal is used to seal around the sound opening from the inside with the cap,
wherein an opening is provided in the seal below the sound opening,
wherein the opening is extended through the coating into the intermediate space, so that a continuous sound channel is opened through the sound opening, the seal, and the coating into the intermediate space down to below the MEMS component.

14. The method according to claim 13,
wherein the seal is applied as a viscous compound through the sound opening after the placement of the cap and is subsequently cured.

15. The method according to claim 13, wherein the seal is arranged above the intermediate space before the placement of the cap on the coating.

16. The method according to claim 15,
wherein a sealing ring made of elastic material is arranged on the coating above the intermediate space as the seal.

17. The method according to claim 13,
wherein the seal is applied as a viscous compound that is elastic in the cured state, the seal being applied into the intermediate space between coating and the cap in the region of the sound opening so that the seal solidly closes the sound opening and seals the edges thereof from the coating,
wherein the opening in the seal and in the coating is subsequently created by laser drilling.

18. A method of applying a coating to a structural element having a coating region and an uncoated region, comprising:
applying a release film to the coating region and at least partially within the uncoated region;
removing the release film from the coating region such that the release film remains in the uncoated region;
applying the coating over the structural element in the coating region and the uncoated region;
severing the coating circumferentially around the coating region along a partition line between the coating region and the uncoated region;
reducing an adhesion of the release film within the uncoated region; and
after the reducing, removing the release film together with the coating applied over the release film from the uncoated region.

19. The method according to claim 18, wherein the structural element is a MEMS component that is part of an assembly arranged on a carrier, and wherein the applying the release film includes sealing off a recess region of the MEMS component on the carrier with the release film, the recess region being the uncoated region.

20. The method according to claim 18, wherein the release film is a UV-release tape or a thermal-release tape and the reducing the adhesion of the release film is accomplished by exposing the release film to UV light, a laser, or thermal action.

* * * * *